United States Patent
Rao et al.

(10) Patent No.: US 10,317,428 B2
(45) Date of Patent: Jun. 11, 2019

(54) PROBE CONNECTOR FOR A PROBING PAD STRUCTURE AROUND A THERMAL ATTACH MOUNTING HOLE

(71) Applicant: INTEL CORPORATION, Santa Clara, CA (US)

(72) Inventors: Vikas Rao, Bangalore (IN); Navneet K. Singh, Bangalore (IN); Naveen G, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 210 days.

(21) Appl. No.: 15/341,726

(22) Filed: Nov. 2, 2016

(65) Prior Publication Data

US 2018/0120347 A1    May 3, 2018

(51) Int. Cl.
*G01R 1/04* (2006.01)
*G01R 1/073* (2006.01)

(52) U.S. Cl.
CPC ....... *G01R 1/0416* (2013.01); *G01R 1/07371* (2013.01)

(58) Field of Classification Search
CPC .......... G06K 7/10465; G06K 7/10356; G06K 7/10336; G06K 7/10346; G01N 27/72
USPC ...... 324/200, 207.3, 244, 253, 254
See application file for complete search history.

(56) References Cited

U.S. PATENT DOCUMENTS

| | | | |
|---|---|---|---|
| 3,858,159 A * | 12/1974 | Worth | H01R 12/675 439/399 |
| 6,392,317 B1 * | 5/2002 | Hall | E21B 17/003 174/47 |
| 2006/0178047 A1 * | 8/2006 | Croan | H01R 13/6272 439/578 |
| 2006/0217906 A1 * | 9/2006 | Barbara | G01R 1/36 702/60 |
| 2010/0281854 A1 * | 11/2010 | Huang | F02D 41/1495 60/276 |
| 2012/0182023 A1 * | 7/2012 | Zhang | G01M 11/3109 324/501 |

OTHER PUBLICATIONS

"Debug Port Design Guide for UP/DP Systems" Jun. 2006.

* cited by examiner

*Primary Examiner* — Giovanni Astacio-Oquendo
(74) *Attorney, Agent, or Firm* — Lowenstein Sandler LLP

(57) ABSTRACT

Disclosed herein is technology of a probe connector for a probing pad structure around a thermal attach mounting hole. A probe connector includes a socket frame including a first channel and an elongated body including a second channel. Socket conductors are disposed in the socket frame around the first channel. The second channel is disposed at a first distal end of the elongated body, and the elongated body is disposed on the socket frame. The socket conductors are to make electrical contact with a probing pad structure disposed on a surface area around a thermal attach mounting hole of a circuit board in response to a loading attachment engaging with the elongated body via the second channel, the socket frame via the first channel, and the circuit board via the thermal attach mounting hole.

20 Claims, 14 Drawing Sheets

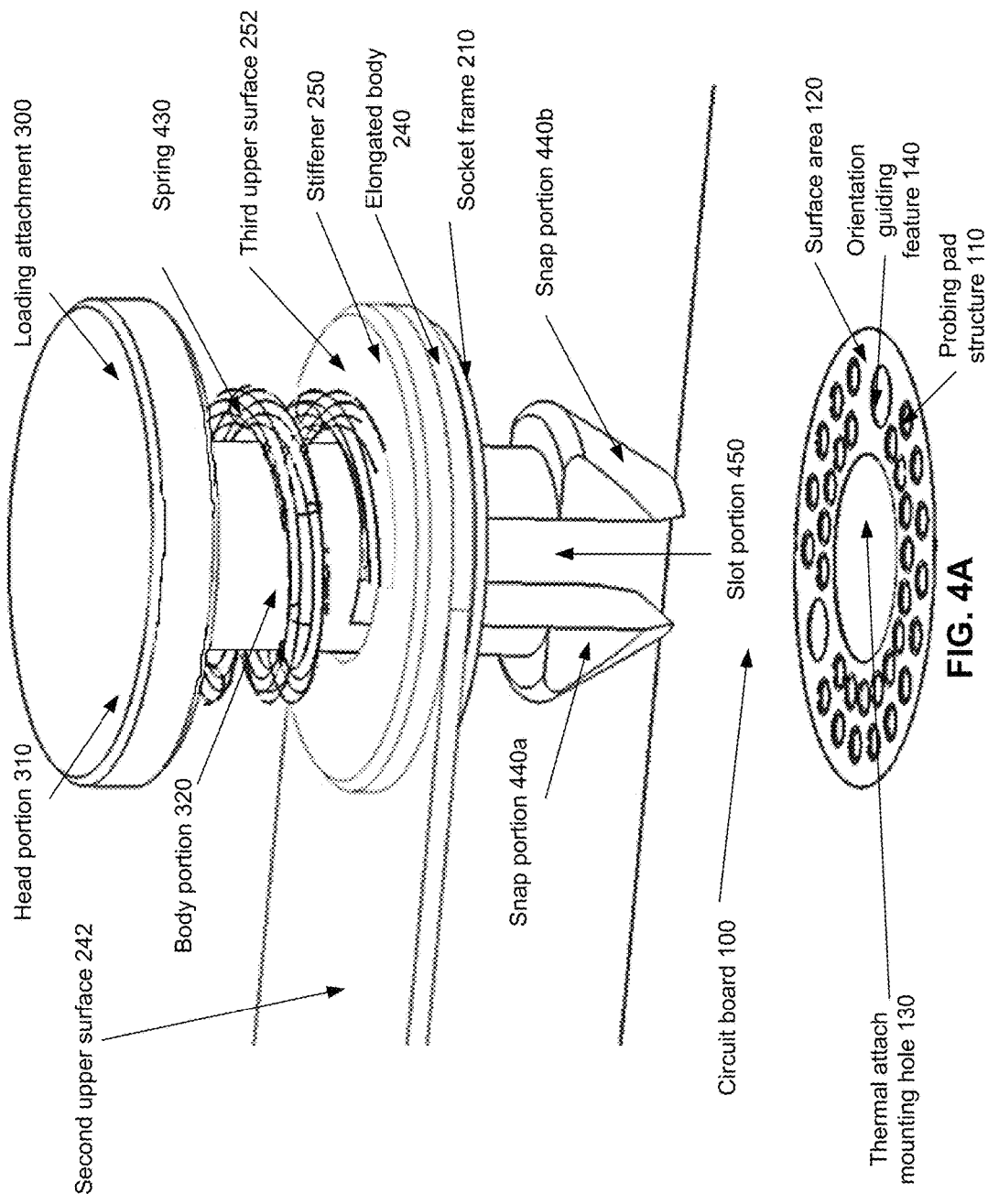

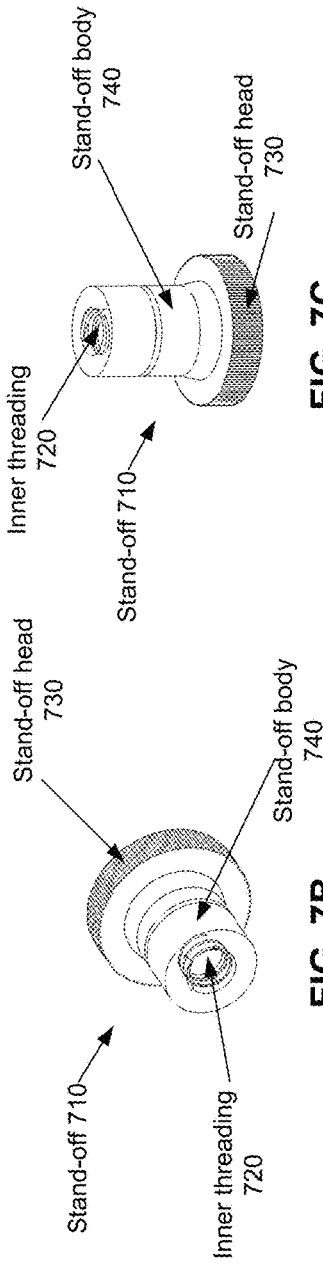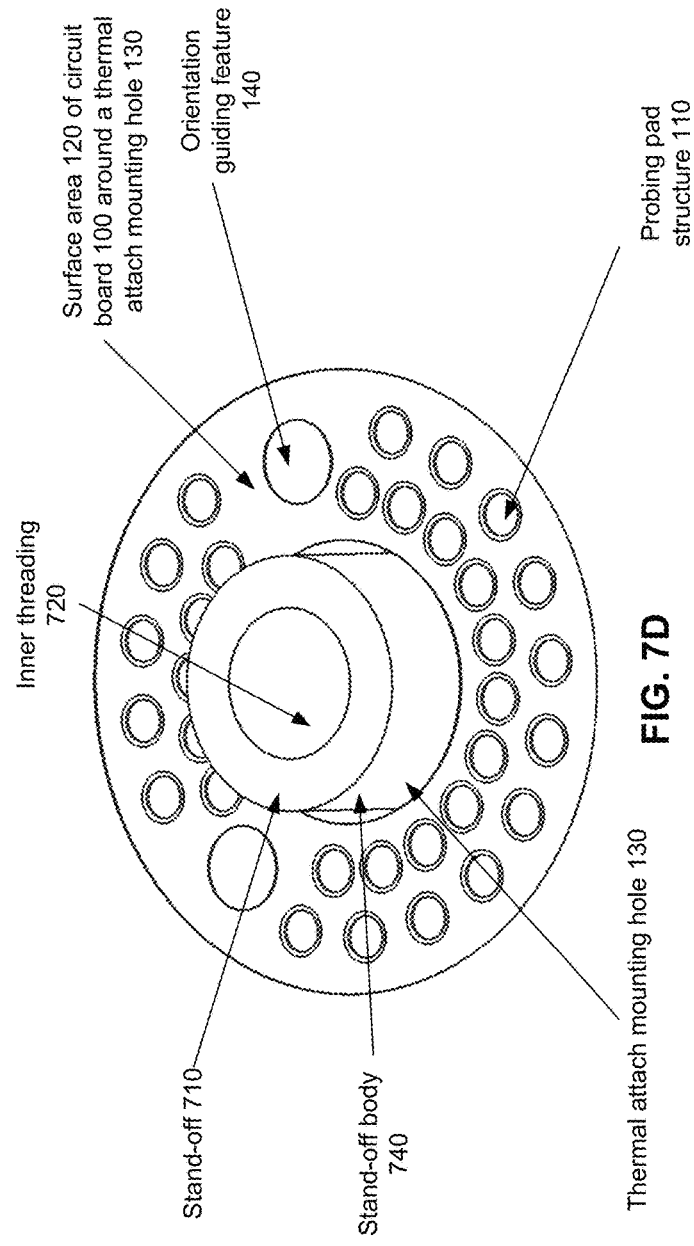

PROBE CONNECTOR FOR A PROBING PAD STRUCTURE AROUND A THERMAL ATTACH MOUNTING HOLE

BRIEF DESCRIPTION OF THE DRAWINGS

FIG. 4A is a perspective view illustrating a loading attachment, the probe connector, and the circuit board, according to another embodiment.

FIGS. 7B-7C illustrate the stand-offs for coupling the thermal attach bottom plate to the circuit board and the probe connector, according to an embodiment.

FIG. 7D illustrates a stand-off coupled to a circuit board for engaging with the loading attachment, according to one embodiment.

DESCRIPTION OF EMBODIMENTS

Figure 1:
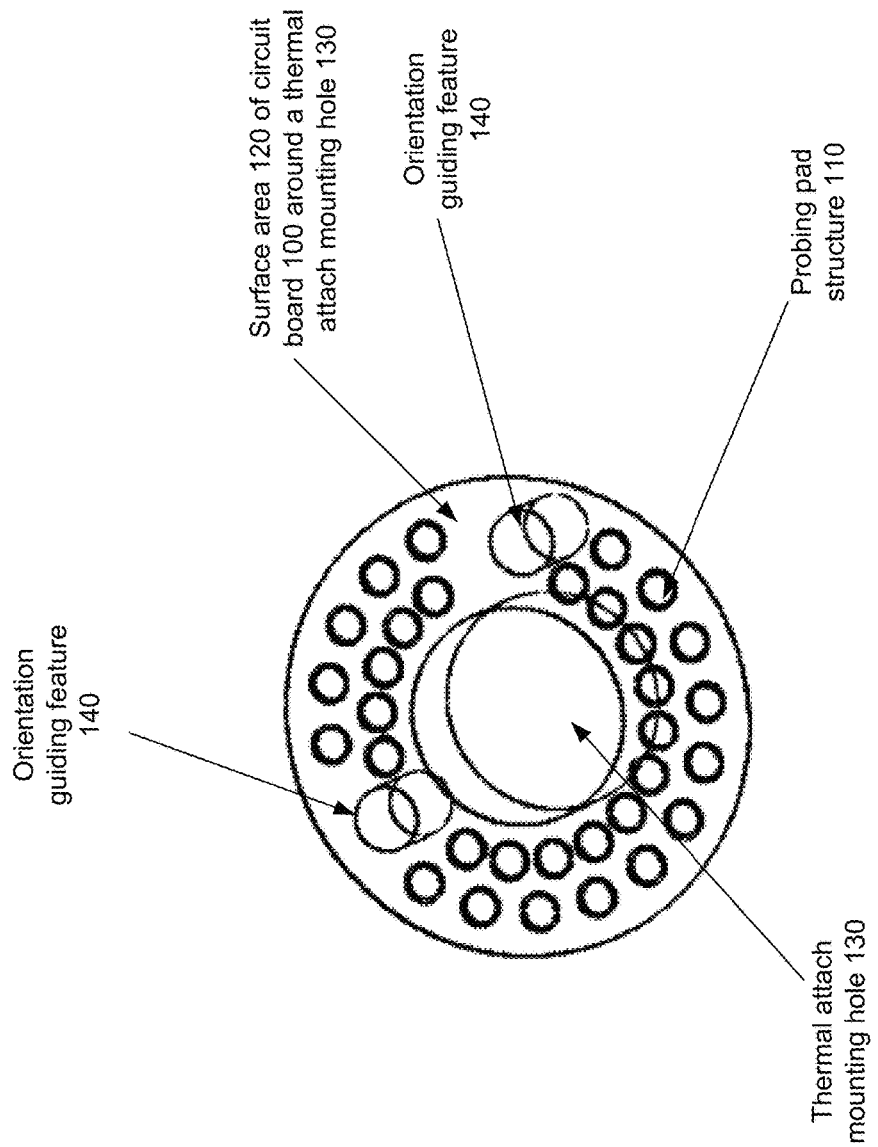
FIG. 1 illustrates a probing pad structure on a surface area around a thermal attach mounting hole of a circuit board, according to one embodiment.

A probe can be used to receive signals from a circuit board. These signals may include central processing unit (CPU) debugging signals, platform controller hub (PCH) debugging signals, voltage margining signals, miscellaneous signals (e.g., power measurement Kelvin sense, hardware strap probing, serial peripheral interface (SPI) flash, runtime flash, etc.), and so forth. A probe can be used to design computer hardware and processors, to control a processor at register level, to root-cause post validation and field failure issues of components, and to access individual registers, counters, and instructions within a device.

Coupling the probe to the circuit board requires routing area (e.g., in the core break-out/routing region) in the circuit board and surface area on the circuit board. This interferes with having a compact design of a circuit board area and layout design.

An example of physically coupling a probe (e.g., in-target probe (ITP)) to the circuit board is via a surface mounted debug connector (e.g., surface mounted Samtec connector for installing extended debug port (XDP) hardware). The surface mounted debug connector is soldered to the circuit board and about thirty-five signals are routed from silicon (e.g., CPU, PCH) to the surface mounted debug connector through the circuit board. The routing consumes routing space on the circuit board (e.g., a large amount of routing space in the core break-out/routing region) and the surface mounted debug connector consumes surface area on the circuit board. By taking up available routing space and surface area on a circuit board, the surface mounted debug port limits how compact the design of the circuit board can be and limits the circuit board layout. Industry adoption of the surface mounted debug connector is limited due to cost and complexity of the surface mounted debug connector.

To forgo the cost of the surface mounted debug connector and to save routing area, conventional circuit boards (e.g., form-factor motherboards) do not include a surface mounted debug connector. This causes a lack of debug support for central processing units (CPUs) and platform controller hubs (PCHs). The lack of debug support makes it impossible to root-cause post validation and field failure issues of components on a circuit board.

Another example of physically coupling a probe to a circuit board is via a chassis mount connector that couples to the circuit board via a chassis mounting hole. The chassis mount connector is installed on form-factor circuit boards and only in the open chassis condition. The chassis mount connector uses signal routing from the CPU to the chassis mounting hole, which also occupies substantial routing area of the circuit board. The chassis mount connector is non-standard and only has specific implementations.

Voltage margining of a circuit board requires additional resistors and volt margining connectors mounted on the circuit board. This also consumes substantial routing space (e.g., core circuit board routing area) and causes other routing in the circuit board to be more complex. This also increases cost of the circuit board.

Many circuit boards contain multiple miscellaneous signals (e.g., power measurement Kelvin sense, hardware strap probing, serial peripheral interface (SPI) flash, runtime flash, etc.) which are not brought out for probing as it increases the complexity of routing for other signals.

The embodiments described herein provide a probing solution that transmits one or more of debugging signals, voltage margining signals, miscellaneous signals, etc. to an external probe while minimizing routing area and surface area of a circuit board. The embodiments described herein provide a probing solution that is scalable across products, minimizes design and manufacturing time, and offers a simple debug solution for resolving field issues.

A probe connector for a probing pad structure around a thermal attach mounting hole (e.g., a near CPU probe (NCP) solution), as described in various embodiments herein, is a cost-effective probing solution that is scalable across products and platforms and is a universal solution which can be standardized. The NCP solution helps to avoid overhead of routing signals on circuit boards to a surface mounted debug connector or a chassis mount connector and eliminates surface mounting a surface mounted debug connector on the circuit board. The NCP solution can enable having a compact design form-factor circuit board design with debugging capabilities without increasing complexity of routing.

The NCP solution may include a probe connector and a probing pad structure disposed on a surface area around a thermal attach mounting hole of a circuit board.

FIG. 1 illustrates a probing pad structure 110 on a surface area 120 around a thermal attach mounting hole 130 of a circuit board 100, according to one embodiment. The probing pad structure 110 is coupled to the circuit board 100. The probing pad structure 110 may be a copper pad structure (e.g., pattern of contacts (e.g., one or more of land grid array (LGA) contacts, ball grid array (BGA) contacts, etc.)) of specific debug signals. The probing pad structure 110 may include a plurality of pads (e.g., about 36) that are routed through the circuit board 100 (e.g., each of the pads in probing pad structure 110 is coupled to one or more wires that are routed through circuit board 100 (e.g., to CPU, PCH, etc.)). The probing pad structure 110 may be varied by one or more of changing pitch of the probing pad structure 110, changing diameter of the probing pad structure 110, or changing the pattern of the probing pad structure 110. The circuit board 100 may be a form-factor motherboard (e.g., standard dimensions, standard locations of thermal attach mounting holes, standard size of thermal attach mounting holes, etc.). The circuit board may be one or more of a reference validation platform (RVP), a development platform or kit (e.g., Aero, Edison (Arduino), quark-based developer kits), or customer reference board (CRB) (e.g., a platform provided by a part (e.g., chip, microchip, processor, etc.) manufacturer to allow customers to evaluate the parts; may include hardware, software, firmware, etc.; may be installable on a server, computer, etc. to evaluate the part; etc.). The probing pad structure 110 may enable the probing of the signals of the circuit board by a probe 500 via a probe connector 200 (see FIG. 5).

Figure 3A:
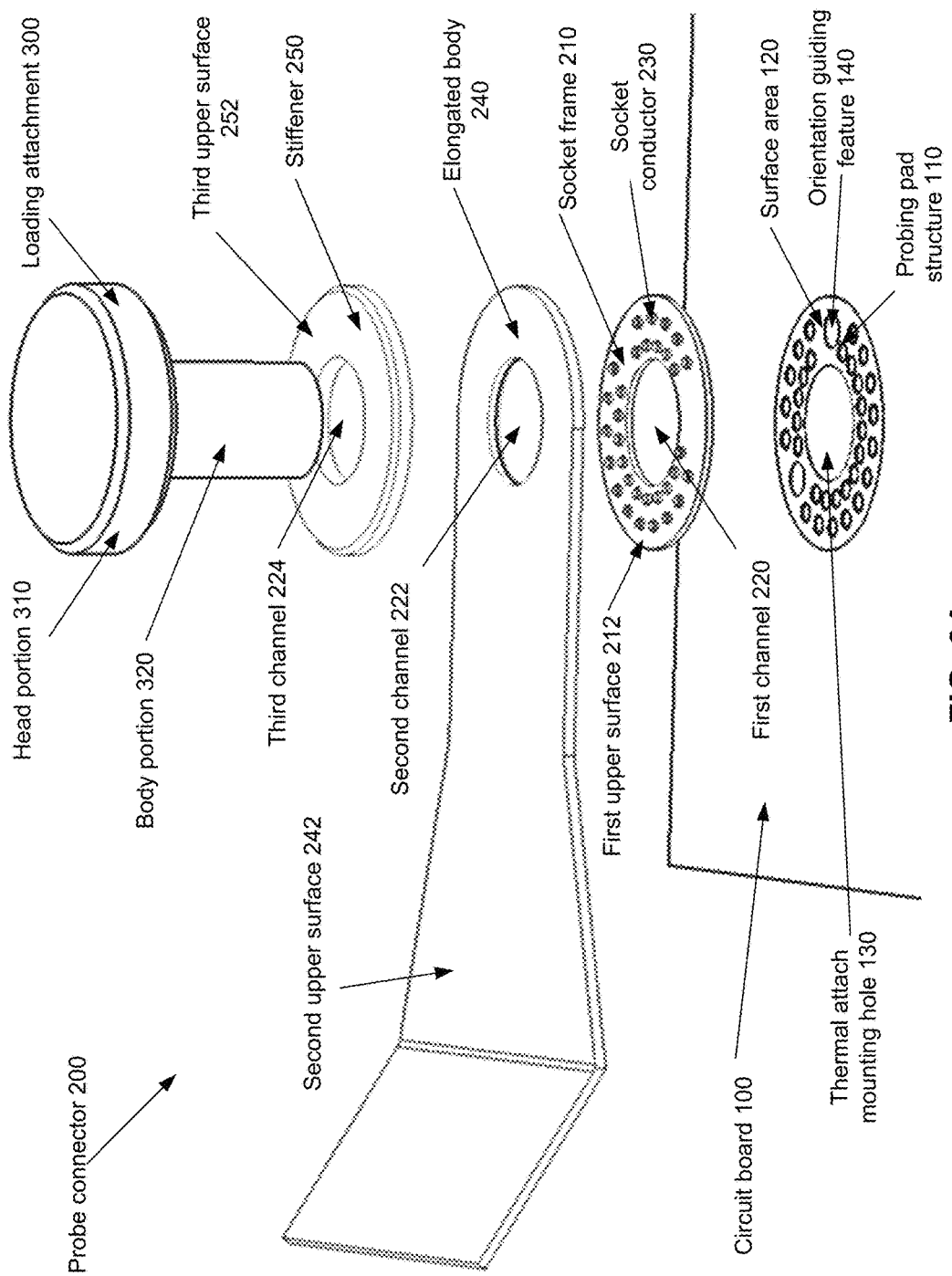
FIG. 3A is an exploded perspective view illustrating a loading attachment, the probe connector, and the circuit board, according to one embodiment.

The surface area 120 around the thermal attach mounting hole 130 is effectively utilized on the circuit board 100 by converting the surface area 120 into a signal probing region and allows probing when making electrical connection with a probe connector 200 (see FIG. 3A).

The surface area 120 may also include orientation guiding features 140. The orientation guiding features 140 may be one or more of markings, fool-proofing features (e.g., guiding holes, guiding extrusions), etc. The orientation guiding features 140 may cause the probe connector 200 to be oriented away from the CPU or PCH (see FIG. 5).

Figure 2A:
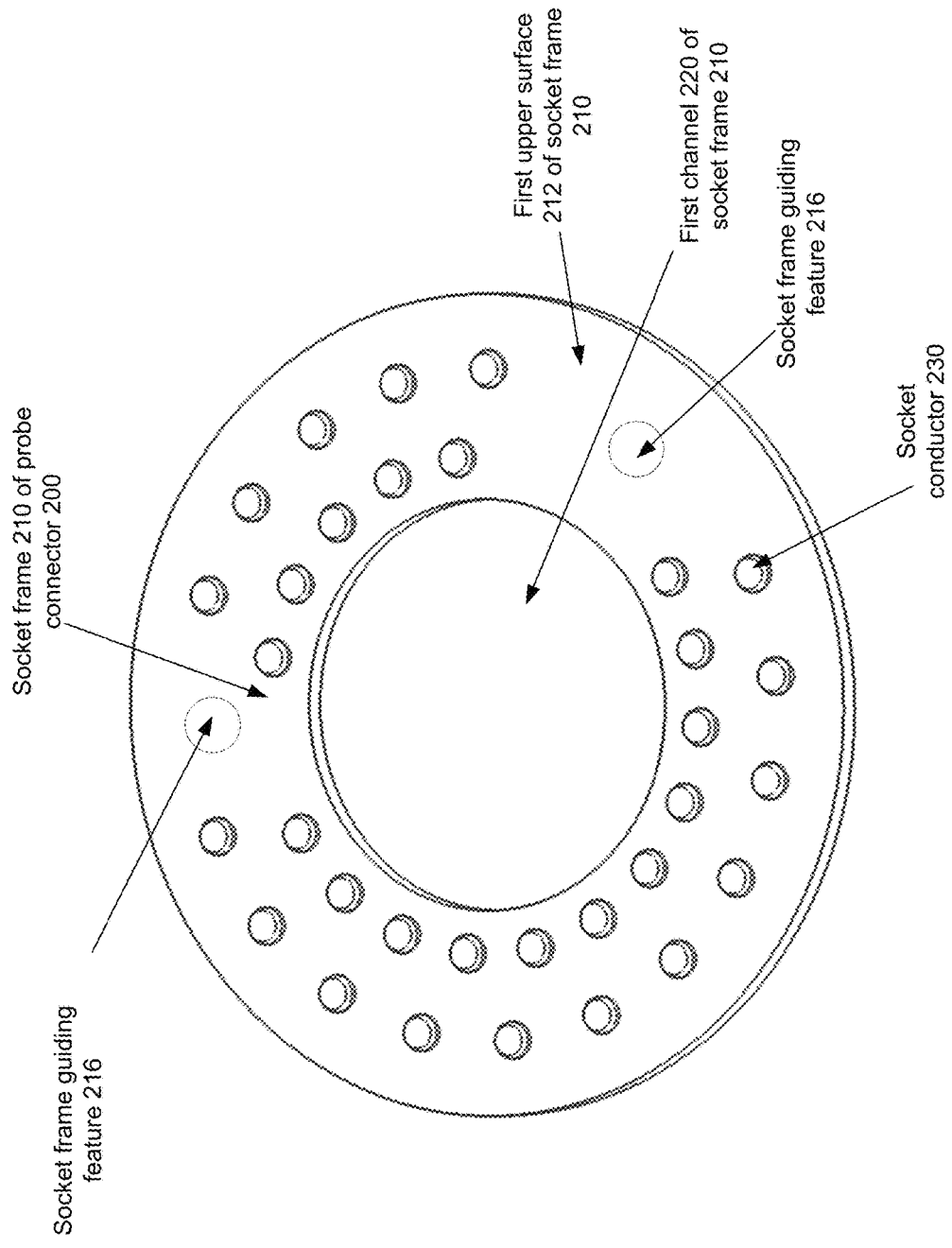
FIG. 2A illustrates a socket frame of a probe connector, according to one embodiment.

FIG. 2A illustrates a socket frame 210 of a probe connector 200, according to one embodiment. The socket frame 210 includes a first upper surface 212 and a first lower surface 214 (see FIG. 2B). A first channel 220 traverses the socket frame 210 from the first upper surface 212 to the first lower surface 214 (see FIG. 2B). In one implementation, the socket frame 210 is an elastomer socket frame. In one implementation, the socket frame 210 is a pogo-pin type socket frame. In one implementation, the socket frame 210 is a wire mesh (e.g., matrix) type socket frame. In one implementation, the socket frame 210 is a push-button type socket frame. In on implementation, the socket frame 210 is another means for holding socket conductors 230 around the first channel 220 in the means for holding. Each of the socket conductors may be substantially parallel.

Socket conductors 230 (e.g., about 36 socket connectors, about 36 socket columns) are disposed in the socket frame 210 around the first channel 220. The socket conductors 230 are substantially perpendicular to and traverse the first upper surface 212 and the first lower surface 214 (see FIG. 2B).

The socket conductors 230 of socket frame 210 may match with the probing pad structure 110 (see FIG. 1) on circuit board 100 (e.g., 36 socket conductors 230 that align with 36 contacts on probing pad structure 110). The socket conductors 230 may support one or more of LGA or BGA contacts. In one embodiment, an upper surface of the socket conductors 230 (e.g., disposed proximate the upper surface 212) supports LGA contacts and a lower surface of the socket conductors 230 (e.g., disposed proximate the lower surface 214 (see FIG. 2B)) supports BGA contacts. In another embodiment, the upper surface of the socket conductors 230 supports BGA contacts and a lower surface of the socket conductors 230 supports LGA contacts. In another embodiment, both upper and lower surfaces of the socket conductors 230 support LGA contacts. In another embodiment, both upper and lower surfaces of the socket conductors 230 support BGA contacts.

The socket frame 210 may have socket frame guiding features 216 that engage (e.g., connect, mate, bond, etc.) with the orientation guiding features 140 of the surface area 120 of the circuit board 100 around the thermal attach mounting hole 130. In one embodiment, the orientation guiding features 140 are guiding holes and the frame guiding features 216 are guiding extrusions. In one embodiment, the orientation guiding features 140 are guiding extrusions and the frame guiding features 216 are guiding holes. In one embodiment, the orientation guiding features 140 and the guiding features 216 form a connection with each other (e.g., a magnetic bond, a hook and loop connection, etc.)

The socket frame guiding features 216 may align the socket conductors 230 with the probing pad structure 110.

Figure 2B:
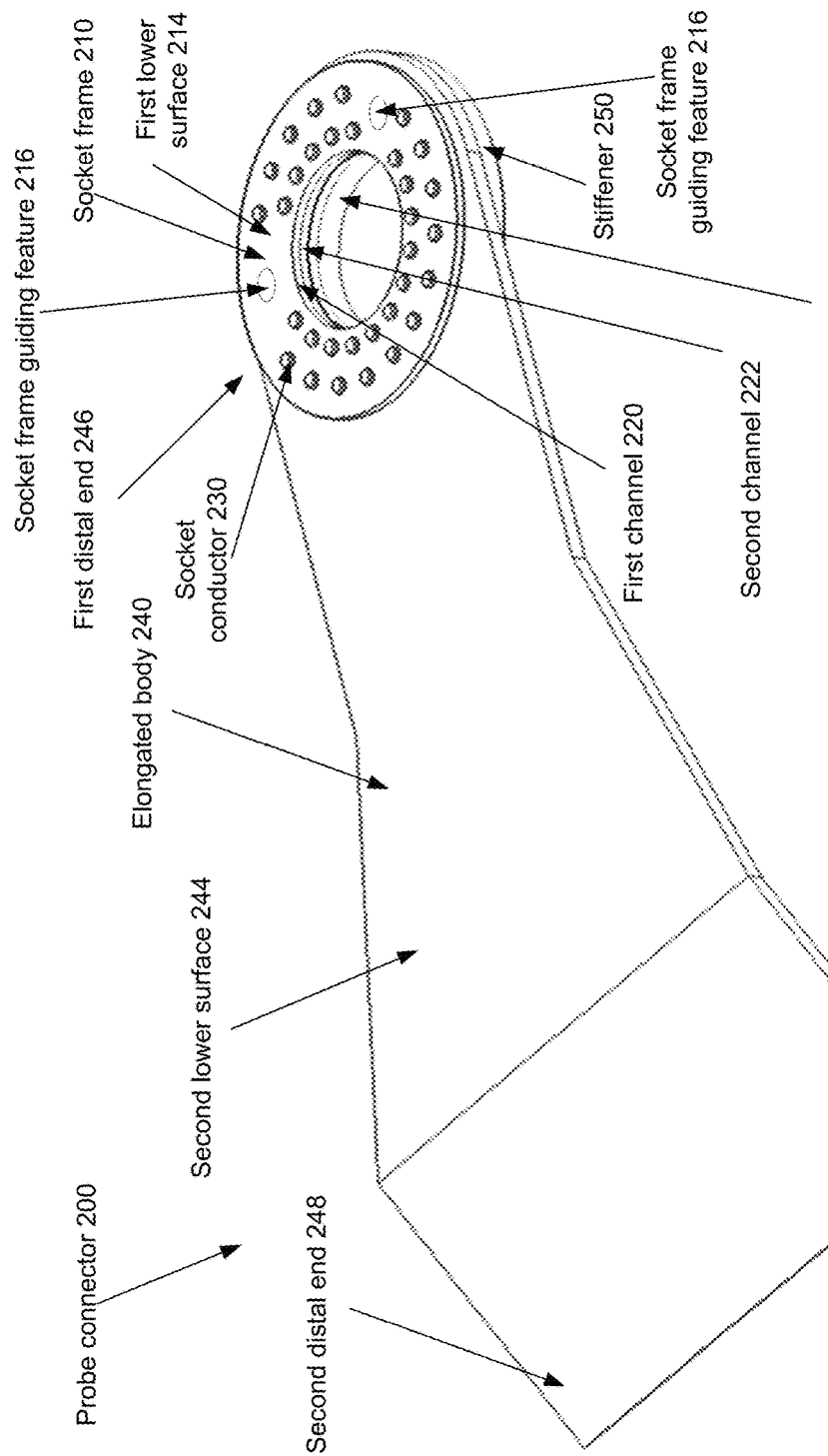
FIG. 2B illustrates a probe connector, according to one embodiment.

FIG. 2B illustrates a probe connector 200, according to one embodiment. The probe connector 200 includes a socket frame 210 (see FIG. 2A) and an elongated body 240.

The elongated body 240 includes a second upper surface 242 (see FIG. 3A) and a second lower surface 244. A second channel 222 traverses the elongated body 240 from the second upper surface 242 (see FIG. 3A) to the second lower surface 244. The second channel 222 is disposed at a first distal end 246 of the elongated body 240. The second lower surface 244 of the elongated body 240 is disposed on the first upper surface 212 (see FIG. 2A) of the socket frame 210.

In one embodiment, the elongated body 240 includes a printed circuit board (PCB). In another embodiment, the elongated body 240 includes a flexible printed circuit (FPC).

The elongated body 240 includes one or more conductors. The conductors may be one or more of wires, traces, transmission lines, etc. The conductors may be disposed on the second lower surface 244 of the elongated body 240. The conductors may be disposed on the second upper surface 242 of the elongated body 240. The conductors may be disposed in the elongated body 240. The conductors may make electrical connection with terminals at the second distal end 248 of the elongated body 240. The terminals may make electrical connection with a probe 500. The conductors may make electrical connection with the socket conductors 230 at the first distal end 246.

The second lower surface 244 of the first distal end 246 of the elongated body 240 and the first upper surface 212 of the socket frame 210 may have corresponding guiding features to couple the socket conductors with the corresponding conductors in the elongated body 240. The second lower surface 244 of the first distal end 246 of the elongated body 240 and the first upper surface 212 of the socket frame 210 may be coupled together (e.g., chemically bonded, thermally bonded, frictionally fit, pressure fit, coupled with epoxy, etc.) to couple the socket conductors with the corresponding conductors in the elongated body 240.

The probe connector 200 may include a stiffener 250. The stiffener may have a third upper surface 252 (see FIG. 3A) and a third lower surface 254 (not shown). A third channel 224 may traverse the stiffener 250 from the third upper surface 252 to the third lower surface 254. The third lower surface 254 may be disposed on the second upper surface 242 (see FIG. 3A) of the elongated body 240. In one embodiment, the stiffener 250 is metal. In another embodiment, the stiffener 250 is plastic. The stiffener 250 may protect the elongated body 240 from the loading attachment 300. In one embodiment, the probe connector 200 does not include a stiffener 250.

The second distal end 248 of the elongated body 240 may be oriented away from the circuit board 100 in response to coupling the socket frame guiding features 216 of the socket frame 210 with the orientation guiding features 140 of the surface area 120 around the thermal attach mounting hole 130. In one embodiment, the second distal end 248 may be adapted to couple to a probe 500 (e.g., XDP, SINAI, etc.) via terminals at the second distal end 248. In another embodiment, the elongated body 240 is integrated into a probe 500.

In response to the socket frame guiding features 216 of the probe connector 200 being engaged with the orientation guiding features 140, the orientation guiding features 140 may orient the probe connector 200 so that conductors in the elongated body 240 and traces in the circuit board 100 are aligned (e.g., angle between a trace in the circuit board and a corresponding conductor in the elongated body 240 is substantially 180 degrees, a trace and a corresponding conductor are substantially coplanar in a plane that is substantially perpendicular to the circuit board 100, a trace and a corresponding conductor are oriented in the same direction, etc.). In response to the socket frame guiding features 216 of the probe connector 200 being engaged with the orientation guiding features 140, one or more traces may be aligned with the conductors. In response to the socket frame guiding features 216 of the probe connector 200 being engaged with the orientation guiding features 140, a portion (e.g., the portion proximate the thermal attach mounting hole 130) of the traces may be aligned with the conductors.

In one embodiment, the elongated body 240 is planar. In another embodiment, the elongated body 240 has a first portion (e.g., first distal end 246) is disposed on a first plane and a second portion (e.g., second distal end 248) that is disposed on a second plane, where there is an angle (e.g., about 15 degrees, about 30 degrees, about 45 degrees, about 60 degrees, about 75 degrees, about 90 degrees, etc.) between the first plane and the second plane. The angle between the first plane and the second plane may help orient the probe 500 away from the circuit board 100 (see FIG. 5).

The probe connector 200 may be coupled with the circuit board 100 via a loading attachment 300 (see FIGS. 3A-4B). In one embodiment, the loading attachment 300 is a loading screw (see FIGS. 3A-3B). In another embodiment, the loading attachment 300 is a spring-based snap attachment (see FIGS. 4A-4B). In another embodiment, the loading attachment 300 is another means for electrically coupling the socket conductors 230 with a probing pad structure 110 disposed on a surface area 120 around a thermal attach mounting hole 130 of the circuit board 100. In another embodiment, the loading attachment 300 is another means for fastening the probe connector 200 to the surface area 120 around the thermal attach mounting hole 130 of the circuit board 100. In another embodiment, the loading attachment is another means for extending through the thermal attach mounting hole 130 from a first side of the circuit board 100 and a means for coupling to the means for extending on a second side of the circuit board 100.

FIG. 3A is an exploded perspective view illustrating a loading attachment 300, the probe connector 200, and the circuit board 100, according to one embodiment. A second lower surface 244 (see FIG. 2B) of the elongated body 240 may be disposed on the first upper surface 212 of the socket frame 210. A third lower surface of the stiffener 250 may be disposed on the upper surface 242 of the elongated body. In one embodiment, the loading attachment 300 is metal. In another embodiment, the loading attachment 300 is plastic.

In one embodiment, the socket conductors 230 are to make electrical contact with the probing pad structure 110 disposed on the surface area 120 around the thermal attach mounting hole 130 of the circuit board 100 in response to a loading attachment 300 engaging with the socket frame 210 via the first channel 220, the elongated body 240 via the second channel 222, and the circuit board 100 via the thermal attach mounting hole 130. The socket conductors 230 are to make electrical contact with the elongated body 240. The elongated body 240 is to make electrical contact with a probe 500 (see FIG. 5).

In another embodiment, the socket conductors 230 are to make electrical contact with the probing pad structure 110 disposed on the surface area 120 around the thermal attach mounting hole 130 of the circuit board 100 in response to a loading attachment 300 engaging with the socket frame 210 via the first channel 220, the elongated body 240 via the second channel 222, the stiffener 250 via the third channel 224, and the circuit board 100 via the thermal attach mounting hole 130.

In one embodiment, one or more of socket frame 210, elongated body 240, and stiffener 250 are removably coupled to each other in response to loading attachment 300 engaging with the probe connector 200 and the circuit board 100. One or more of socket frame 210, elongated body 240, and stiffener 250 may be interchangeable from one probe connector 200 to another probe connector 200. In another embodiment, one or more of the socket frame 210, elongated body 240, and stiffener 250 are non-removably coupled. One or more of the socket frame 210, elongated body 240, and stiffener 250 may be chemically bounded together, frictionally bound together, fixed together by an epoxy, thermally fixed to each other, or coupled in another manner.

Figure 3B:
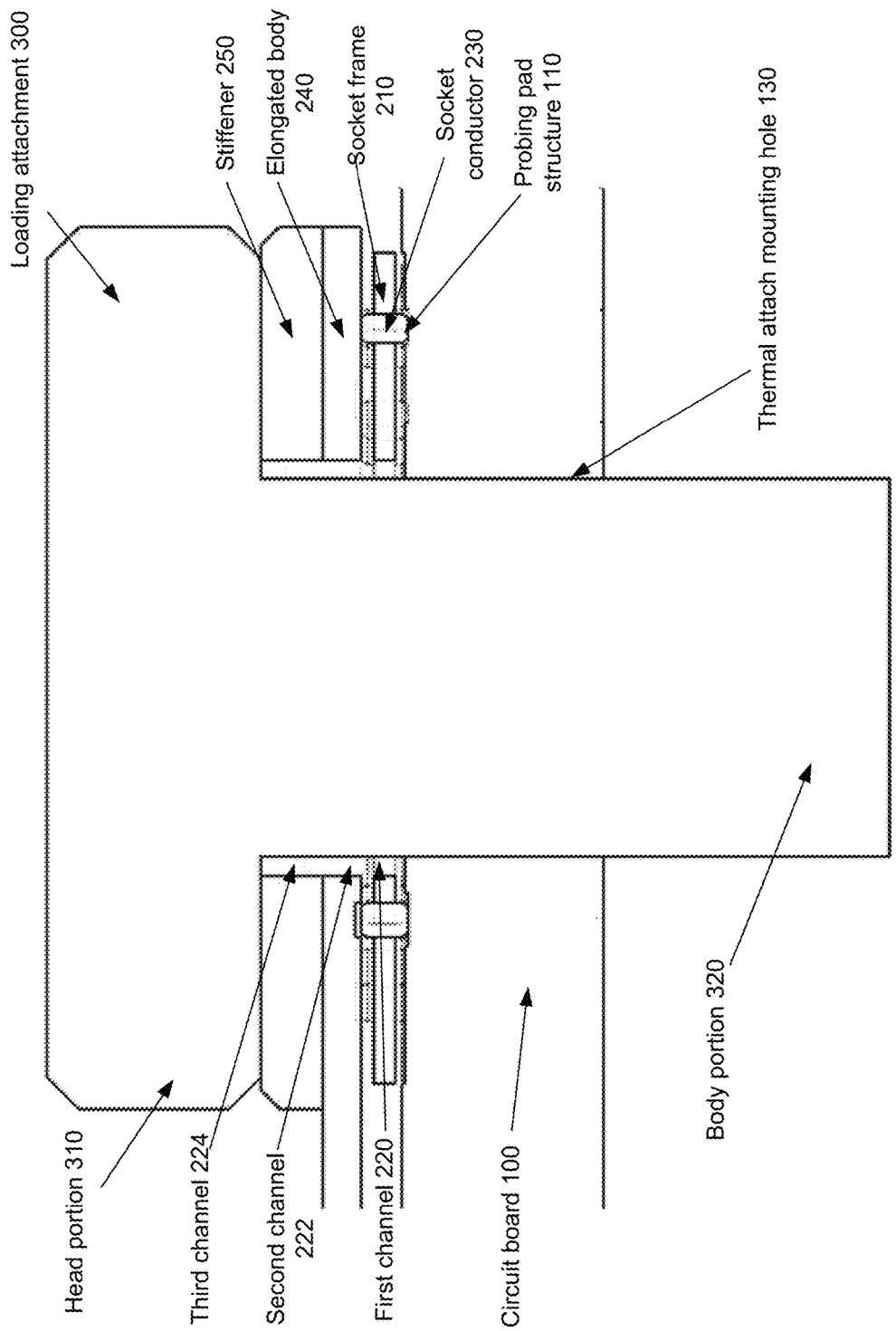
FIG. 3B is a section view illustrating the loading attachment engaging the probe connector and the circuit board, according to one embodiment.

FIG. 3B is a section view illustrating the loading attachment 300 engaging the probe connector 200 and the circuit board 100, according to one embodiment.

In one embodiment, loading attachment 300 is a loading screw. Loading attachment 300 may have a head portion 310 and a body portion 320. The head portion 310 may be formed to be one or more of driven with a tool (e.g., screwdriver, wrench, etc.), turned, or pushed to engage with probe connector 200 and circuit board 100. The head portion 310 may be larger than the body portion 320. In one embodiment, the body portion 320 has substantially the same width (e.g., diameter) as the width (e.g., diameter) of the thermal attach mounting hole 130, so that the loading attachment 300 may have a friction fit with circuit board 100 via thermal attach mounting hole 130. In another embodiment, the body portion 320 has threading to engage with circuit board 100 via thermal attach mounting hole 130. In another embodiment, the body portion 320 may engage with a component (e.g., a stand-off 710 (see FIGS. 7A-7D) within the thermal attach mounting hole 130. In another embodiment, the body portion 320 may traverse the circuit board 100 via the thermal attach mounting hole 130 and engage with a component on the opposite side of the circuit board 100 (e.g., a nut).

The body portion may traverse the stiffener 250 via third channel 224, the elongated body 240 via second channel 222, and the socket frame 210 via first channel 220 and engage with the circuit board 100 via thermal attach mounting hole 130. The lower surface of head portion 310 may be disposed on third upper surface 252 of stiffener 250 or second upper surface 242 of elongated body 240.

In one embodiment, the loading attachment 300 provides about a 25 gram/pin load on each of the plurality of socket conductors 230 (e.g., when the loading attachment 300 engages with the probe connector 200 and the circuit board 100). The loading attachment may removably couple the probe connector 200 to an upper surface of the circuit board 100 and the loading attachment may also removably couple the probe connector 200 to a lower surface of the circuit board 100.

The probe connector 200 may be removably connected to the circuit board 100 (e.g., plug and use) whereas the surface mounted debug connector is surface mounted (e.g., soldered) on the circuit board 100. The probe connector 200 is reusable on multiple circuit boards 100 whereas the surface mounted debug connector is not reusable.

FIG. 4A is a perspective view illustrating a loading attachment 300, the probe connector 200, and the circuit board 100, according to another embodiment.

In one embodiment, the loading attachment 300 is a spring-based snap attachment adapted to mount to the circuit board 100. The loading attachment 300 may include a head portion 310, a body portion 320, a spring 430, snap portions 440a and 400b, and a slot portion 450. The snap portions 440a and 440b may be a first distance apart when a force is not applied to snap portions 440a and/or 440b. The slot portion 450 (and the material and thickness of the snap portions 440a and 440b) may allow the snap portions 440a and 440b to be forced (e.g., moved, squeezed) closer to each other (e.g., a second distance apart which is less than the first distance) to allow passage of the probe connector 200 via channels 222, 224, and 226 and circuit board 100 via thermal attach mounting hole 130 so that body portion 320 traverses the probe connector 200 via channels 222, 224, and 226 and circuit board 100 via thermal attach mounting hole 130. The length of body portion 320, the height and spring constant of spring 430, the thickness of probe connector 200 (e.g., from first lower surface 214 to second upper surface 242, from first lower surface 214 to third upper surface 252, etc.), and the thickness of the circuit board 100 may be adjusted to apply a specific load (e.g., about 25 grams/pin) on each of the socket conductors 230 when the loading attachment 300 is engaged with the probe connector 200 and the circuit board 100. The force applied may be a function of the spring constant of the spring 430 (e.g., the spring constant may depend on material and construction of spring 430) multiplied by the distance that the spring 430 is deformed (e.g., difference between height of spring 430 without force applied (static state) and the height of spring 430 with a force applied). For example, if the specific load is 25 grams/pin for 36 socket conductors 230, then a total load of at least 900 grams may be needed. If the distance that the spring 430 is deformed is 1 mm, then a spring constant of spring 430 of at least 8.829 N/mm may be needed (0.025 kg/pin*36 pins*(9.81 m/sec2)/1 mm=8.829 N/mm). In another embodiment, the loading attachment 300 provides about a 35 gram/pin load on each of the plurality of socket conductors 230.

Figure 4B:
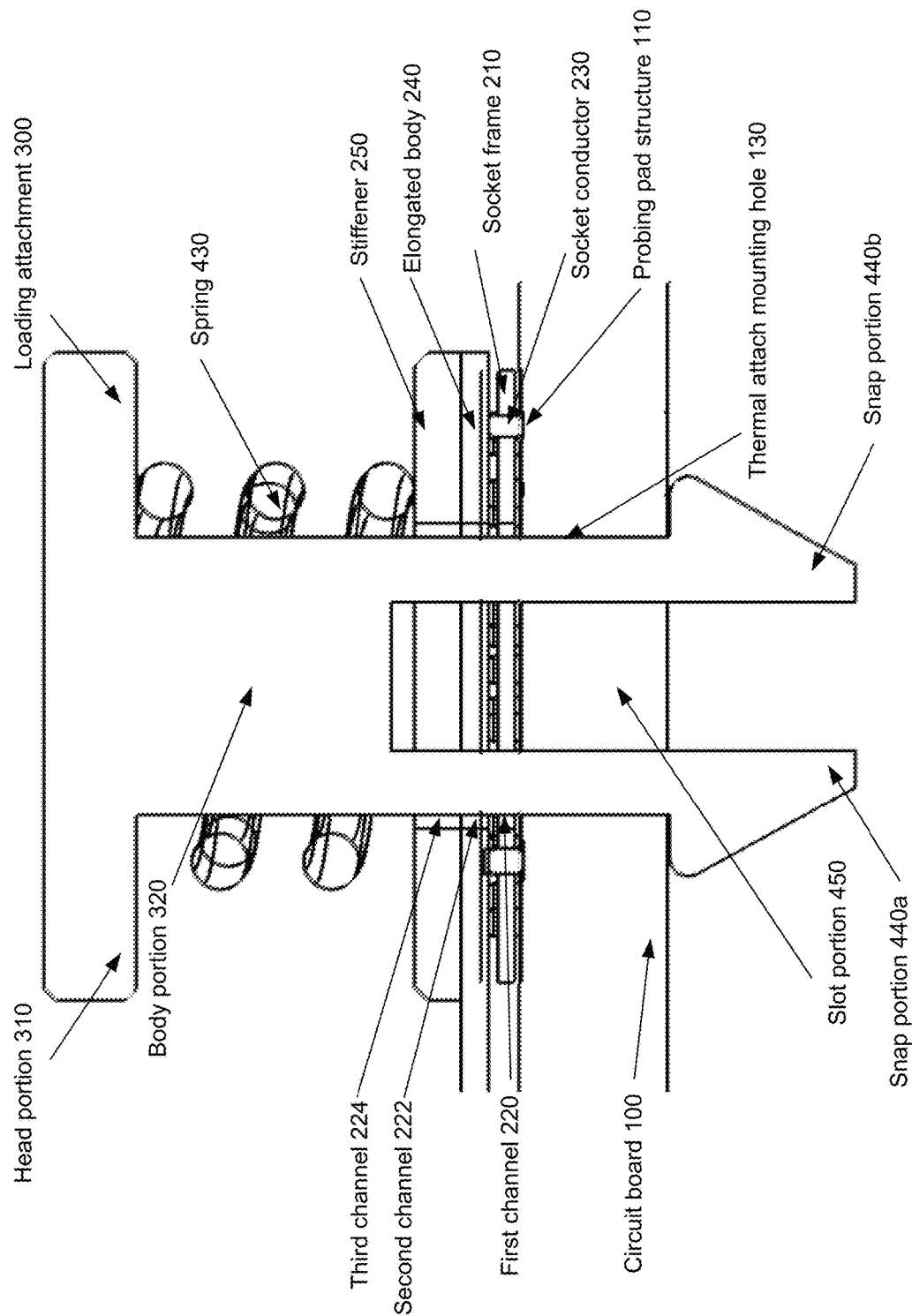
FIG. 4B is a section view illustrating the loading attachment engaging the probe connector and the circuit board, according to another embodiment.

FIG. 4B is a section view illustrating the loading attachment 300 engaging the probe connector 200 and the circuit board 100, according to another embodiment.

In one embodiment, the probe connector 200 may be removed from the circuit board 100 by forcing snap portions 440a and 400b closer together (e.g., squeezing the snap portion 440) to allow passage of the snap portion 440 through the thermal attach mounting hole 130.

In another embodiment, the probe connector 200 may be removed from the circuit board 100 by pulling on the head portion 310 to pull the snap portions 440a and 440b through the thermal attach mounting hole 130 (e.g., the snap portion 440 may disengage from the circuit board 100 if a threshold force is applied, where the threshold force is greater than the force applied for electrical contact between the socket conductors 230 and the probing pad structure 110 (e.g., threshold force is above about 25 g/pin for each socket conductor 230)).

Figure 5:
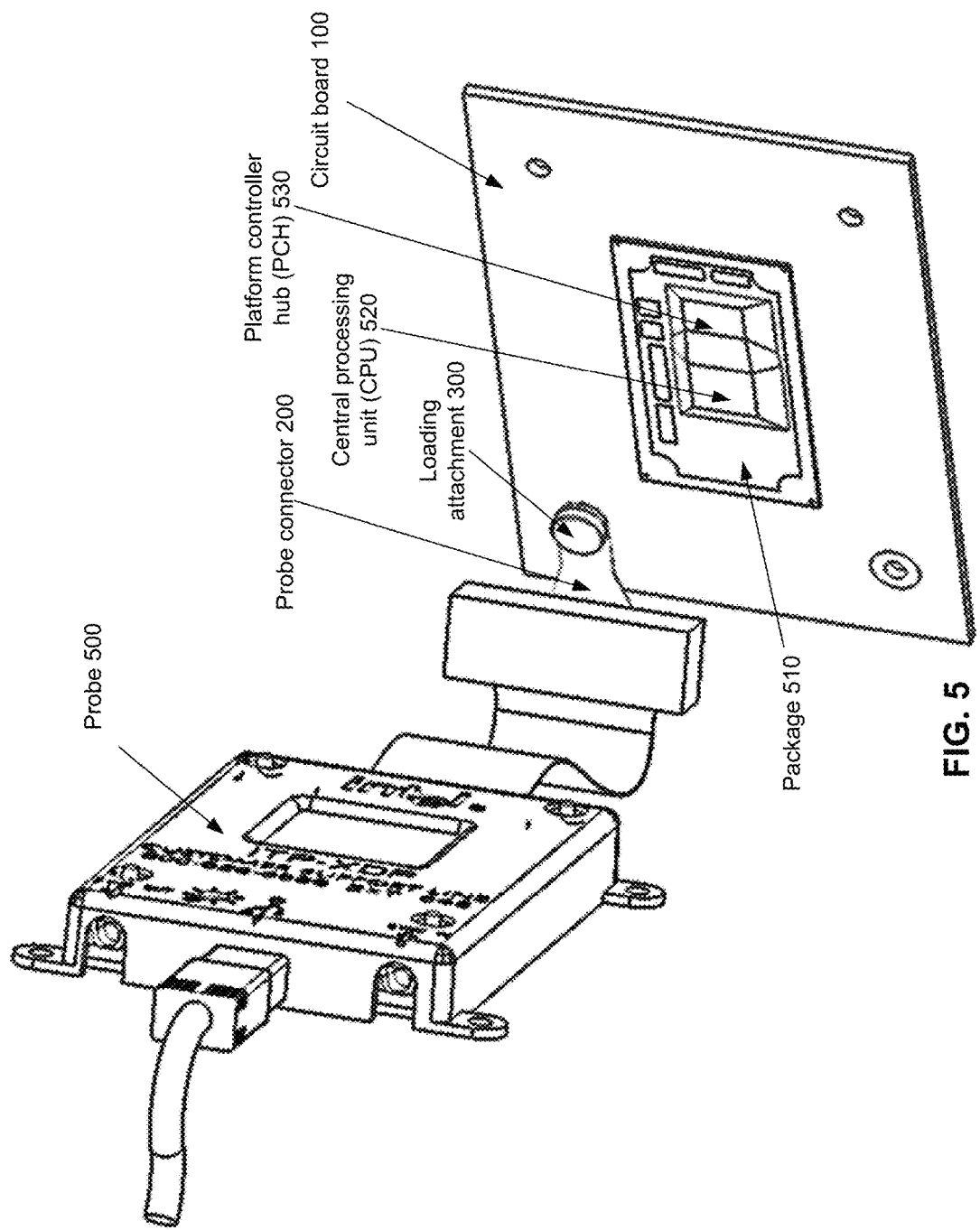
FIG. 5 illustrates a probe, the probe connector, the loading attachment, and the circuit board, according to one embodiment.

FIG. 5 illustrates a probe 500, the probe connector 200, the loading attachment 300, and the circuit board 100, according to one embodiment.

In one embodiment, the probe connector 200 is coupled to probe 500 (e.g., via an interface, via an adaptor, via a connector, etc.). In another embodiment, probe connector 200 is integral to probe 500. Probe 500 may make electrical contact with the probing pad structure 110 (see FIG. 3A) via probe connector 200. Probing pad structure 110 may make electrical contact with one or more components (e.g., package 510, CPU 520, PCH 530, etc.) via wiring routed through circuit board 100. Probe 500 may receive signals from (e.g., take readings of) components such as package 510, CPU 520, and/or PCH 530.

In one embodiment, probe 500 is a debugging probe (e.g., XDP probe) and probe 500 receives debug signals corresponding to CPU 520 coupled to the circuit board 100. In another embodiment, probe 500 (e.g., XDP probe) is a debugging probe and probe 500 receives debug signals corresponding to a PCH 530 coupled to the circuit board 100. In another embodiment, probe 500 is a voltage measurement probe and probe 500 receives voltage margining signals from the circuit board 100. In another embodiment, probe 500 is another means for measuring signals from a circuit board.

Figure 6:
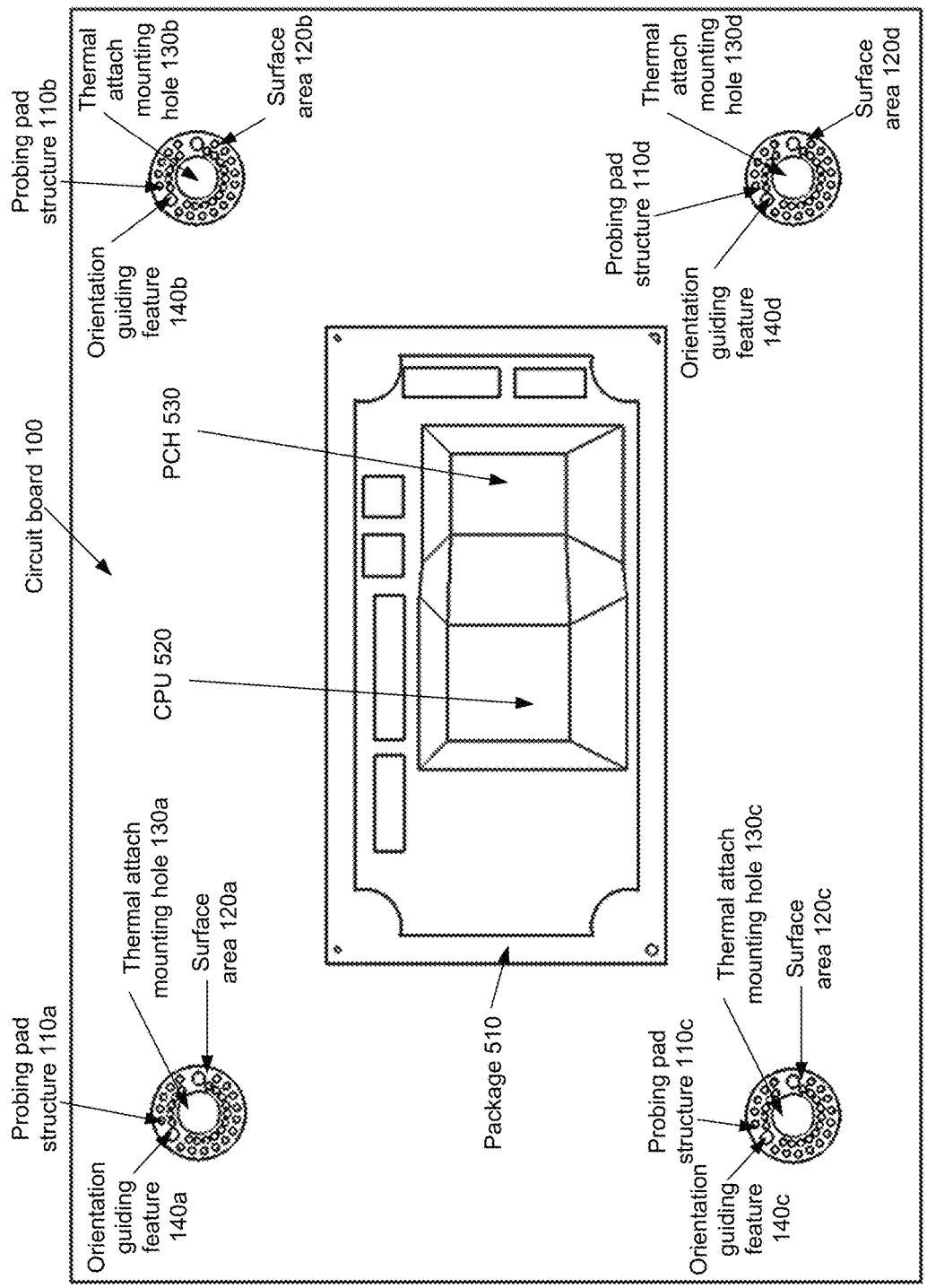
FIG. 6 illustrates a circuit board with probing pad structures on surface areas around thermal attach mounting holes, according to one embodiment.

FIG. 6 illustrates a circuit board 100 with probing pad structures 110 on surface areas 120 around thermal attach mounting holes 130, according to one embodiment.

On any given platform there may be multiple types of debug support required (e.g., external debugging probe (XDP), voltage margining, SINAI, etc.). There may be multiple thermal attach mounting holes 130 (e.g., three or four thermal attach mounting holes 130). By mapping these signals to the nearest thermal attach mounting hole 130, debug support may be provided through probe connector 200 for a majority of signals. CPU/PCH ball map also influences the signal mapping to nearest thermal attach mounting holes 130. FIG. 6 illustrates the mapping of debug signals to the nearest four thermal attach mounting holes 130a-d. Signal mapping can vary based on product requirement.

Each probing pad structure 110a-d may connect to a specific probing signal (e.g., CPU debugging, PCH debugging, voltage margining, miscellaneous signals (e.g., power measurement Kelvin sense, hardware strap probing, serial peripheral interface (SPI) flash, runtime flash, etc.), etc. Probing pad structure 110a on surface area 120a around a thermal attach mounting hole 130a may be used by probe 500 via probe connector 200 to receive miscellaneous signals. Probing pad structure 110b on surface area 120b around a thermal attach mounting hole 130b may be used by probe 500 via probe connector 200 to receive voltage margining signals. Probing pad structure 110c on surface area 120c around a thermal attach mounting hole 130c may be used by probe 500 via probe connector 200 to receive CPU 520 debug signals. Probing pad structure 110d on surface area 120d around a thermal attach mounting hole 130d may be used by probe 500 via probe connector 200 to receive PCH 530 debug signals.

The probe connector 200 is to transmit a first set of signals to the probe 500 in response to the socket conductors 230 making electrical contact with probing pad structure 110a. The probe connector 200 is to transmit a second set of signals to the probe 500 in response to the socket conductors 230 making electrical contact with probing pad structure 110b. The second set of signals is a different type of signals than the first set of signals.

Thermal attach mounting holes 130 are located proximate the CPU 520 and/or PCH 530 (e.g., more proximate to CPU 520 and/or PCH 530 than chassis mounting holes and a surface mounted debug connector). This enables probing signals to be routed for a shorter distance than conventional solutions, saving routing area and layer space in the core region.

A surface mounted debug connector has about 8" to 9" routing length within a circuit board and occupies about 20-25% routing area on a core layer of the circuit board for debug signal routing. For example, a surface mounted debug connector may be placed on the secondary side of a form-factor system circuit board to enable CPU/PCH debugging in an open chassis environment. Due to space and priority of placement of other connectors, surface mounted debug connector placement has last preference and is moved to the lower side of the circuit board. Thirty-five debug signals are routed from the CPU to the surface mounted debug connector. On an eight layer circuit board stack-up, layer 4 is used for surface mounted debug connector signal routing. Overall 1100 mm$^2$ area is used for surface mounted debug connector signal routing on a core layer and in addition the surface mounted debug connector consumes about 232 mm$^2$ of circuit board area. The surface mounted debug connector is not surface mounted by default on the circuit board when the board is integrated on the form-factor system due to height limitation and cost. If there is a field failure on the form-factor system, then a surface mounted debug connector will be surface mounted on the circuit board for debugging. This is not convenient and is a time consuming activity. Supporting debugging on a large volume of form-factor systems using a surface mounted debug connector would be an immense task.

A chassis mount connector (e.g., connect to a chassis mounting hole) also has about 8" to 9" routing length and also occupies about 20-25% routing area on a core layer of a circuit board for debug signal routing.

A probing pad structure 110 around a thermal attach mounting hole 130 of a circuit board 100 may have about 1.5" to 2" routing length and may occupy about 3% routing area on a core layer of a circuit board for debug signal routing. The circuit board 100 with the probing pad structure 110 has an opportunity for board layer count reduction and optimization.

Figure 7A:
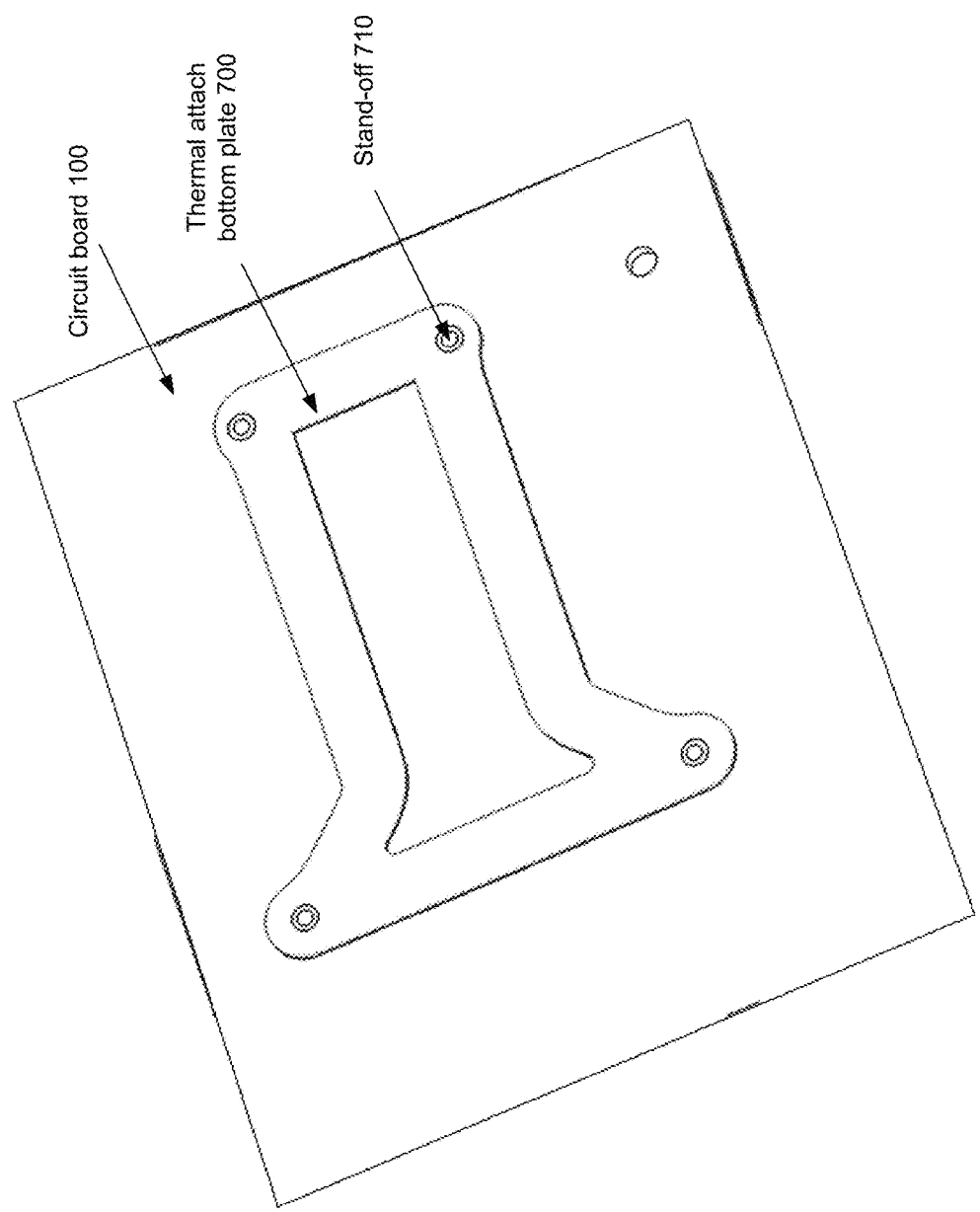
FIG. 7A illustrates a thermal attach bottom plate for coupling with stand-offs via the thermal attach mounting holes to the circuit board and the probe connector, according to an embodiment.

FIG. 7A illustrates a thermal attach bottom plate 700 for coupling with stand-offs 710 via the thermal attach mounting holes 130 to the circuit board 100 and the probe connector 200, according to an embodiment. Thermal attach bottom plate 700 may be attached to an upper surface or a lower surface of the circuit board. In one embodiment, the stand-offs 710 are removably coupled to the circuit board 100 via the thermal attach mounting holes 130. In another embodiment, the stand-offs 710 are non-removably coupled to the circuit board 100 via the thermal attach mounting holes. One or more of the thermal attach bottom plate 700, a stand-off 710, or the circuit board 100 may be one or more of chemically bounded together, frictionally bound together, fixed together by an epoxy, thermally fixed to each other, soldered together, or coupled in another manner.

FIGS. 7B-7C illustrate the stand-offs 710 for coupling the thermal attach bottom plate 700 to the circuit board 100 and the probe connector 200, according to an embodiment.

Stand-off 710 may include inner threading 720, a stand-off head 730, and a stand-off body 740. The stand-off head 730 may engage with the thermal attach bottom plate 700. The stand-off head 730 may include grooves on the outer surface for gripping the stand-off 710. The stand-off body 740 may traverse mounting holes in the thermal attach bottom plate 700 and the thermal attach mounting hole 130 of circuit board 100. The stand-off body 740 may couple one or more of the thermal attach bottom plate 700 and the circuit board 100 by one or more of outer threading on stand-off body 740, soldering, a frictional fit, epoxy, a chemical bond, a thermal bond, or other manner.

FIG. 7D illustrates a stand-off 710 coupled to a circuit board 100 for engaging with the loading attachment 300, according to one embodiment.

The probe connector 200 and probing pad structure 110 may install on either the upper surface or lower surface of the circuit board 100 depending on the stack-up of the circuit board 100, routing in the circuit board 100, and thermal attach bottom plate 700 placement, stand-off 710 placement, and so forth. If a stand-off 710 is soldered on the lower surface of the circuit board 100 and a threading area is projecting out from the upper surface of the circuit board, the probe connector installation can be customized to suit attachment to the threading of the stand-off 710 with respective loading attachments 300 (e.g., screws). A thermal attach bottom plate 700 and a probe connector 200 may simultaneously be coupled to the circuit board (e.g., co-existence) by customizing the design of the probe connector 200.

In one embodiment, stand-off 710 includes inner threading 720 to couple with a loading attachment 300. In one embodiment, stand-off 710 includes outer threading on stand-off body 740 to couple with loading attachment 300. In one embodiment, thermal attach bottom plate 700 is coupled to the circuit board via loading attachment 300 engaging with stand-off 710. The stand-off may include a threading area (e.g., inner threading 720, stand-off body 740, etc.) projecting through the thermal attach mount hole 130. The loading attachment 300 is to couple the probe connector 200 to the circuit board 100 via the threading area of the stand-off 710.

The dimensions of the stand-off 710, the loading attachment 300, and the probe connector 200 provide the force to make electrical contact between the probing pad structure 110 and the socket conductors 230 when loading attachment 300 is coupled with stand-off 710.

Figure 8:
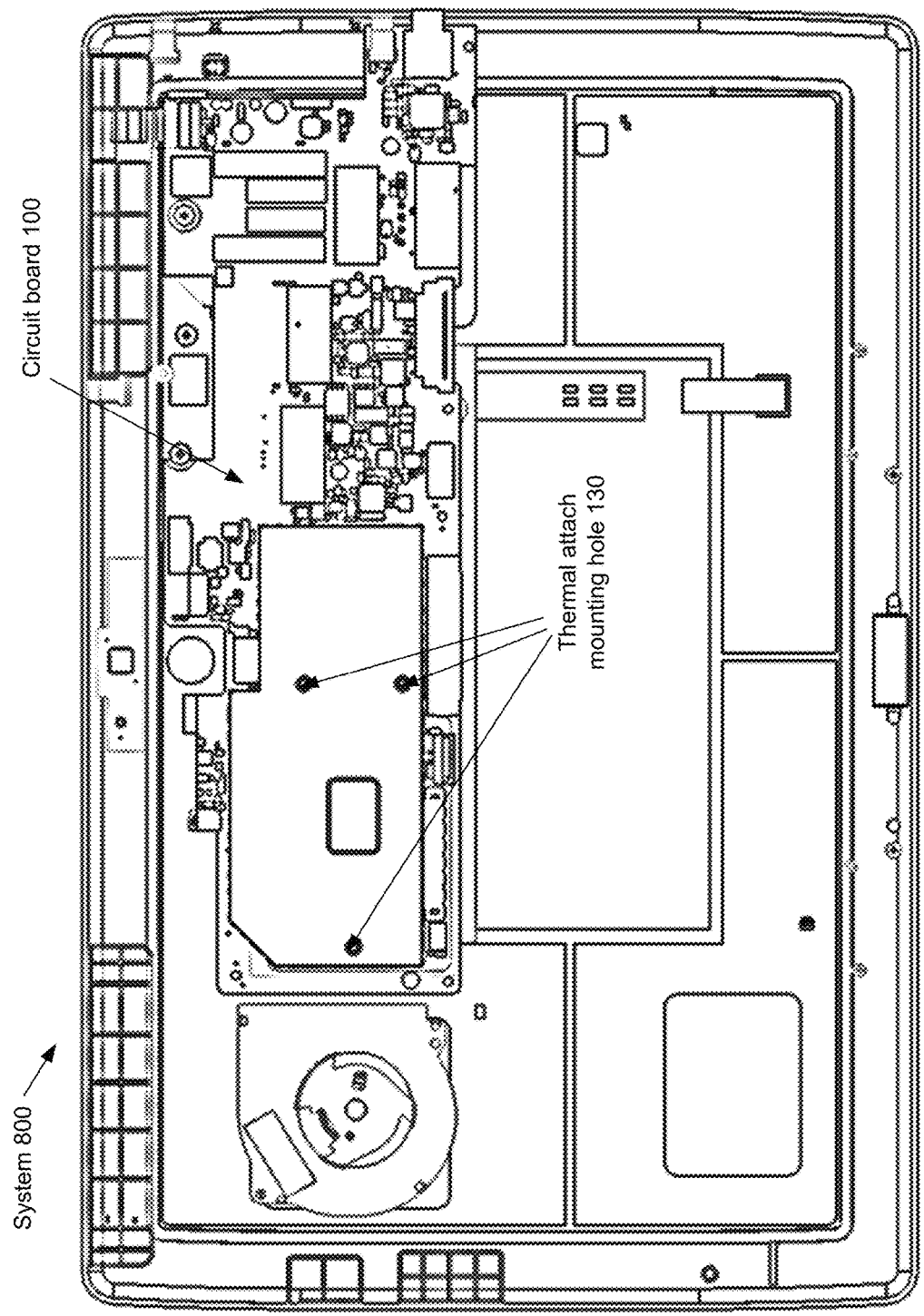
FIG. 8 illustrates a system including a circuit board with thermal attach mounting holes for engaging the circuit board with probe connector, according to one embodiment.

FIG. 8 illustrates a system 800 including a circuit board 100 with thermal attach mounting holes 130 for engaging the circuit board 100 with probe connector 200, according to one embodiment. The system 800 may be one or more of a tablet, a smartphone, a reference tablet, a laptop, a desktop, a closed system, an open system, and so forth. The circuit board 100 may be a motherboard. The circuit board may include three thermal attach mounting holes 130. The thermal attach mounting holes 130 may be passive.

Figure 9:
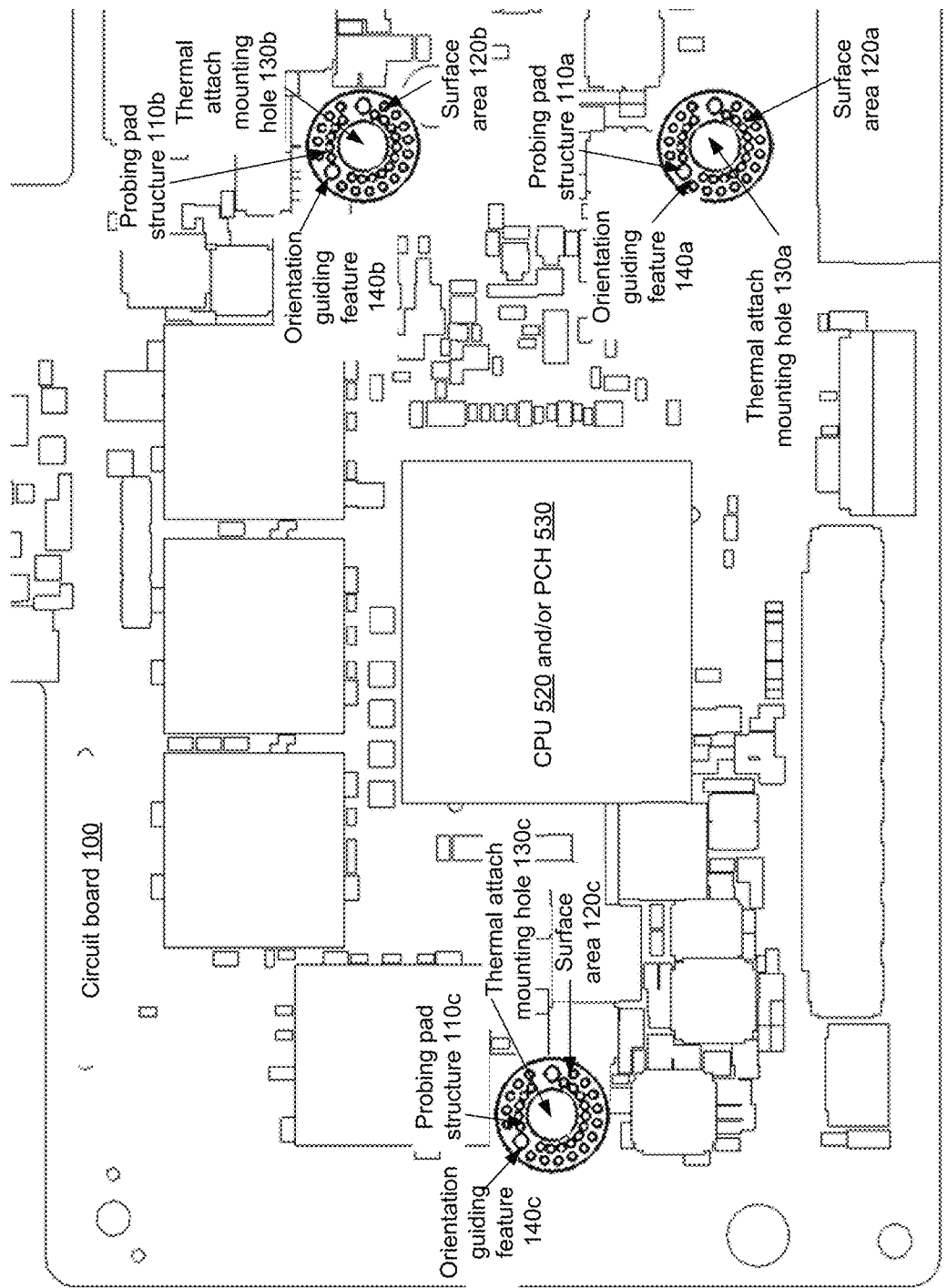
FIG. 9 illustrates a circuit board with thermal attach mounting holes for engaging the circuit board with the probe connector, according to one embodiment.

FIG. 9 illustrates a circuit board 100 with thermal attach mounting holes 130 for engaging the circuit board 100 with probe connector 200, according to one embodiment.

The probing pad structures 110a-c may be used to one or more of the transmit signals as described in FIG. 6. By creating the probing pad structures 110a-c around the three thermal attach mounting holes 130a-c and by terminating the signals (e.g., routing wiring from a component) to the probing pad structures 110a-c (e.g., NCP footprints) will provide capabilities for debug signals (e.g., XDP debug signals), voltage margining signals, and miscellaneous signals (e.g., power measurement Kelvin sense, hardware strap probing, serial peripheral interface (SPI) flash, runtime flash, etc.).

Figure 10:
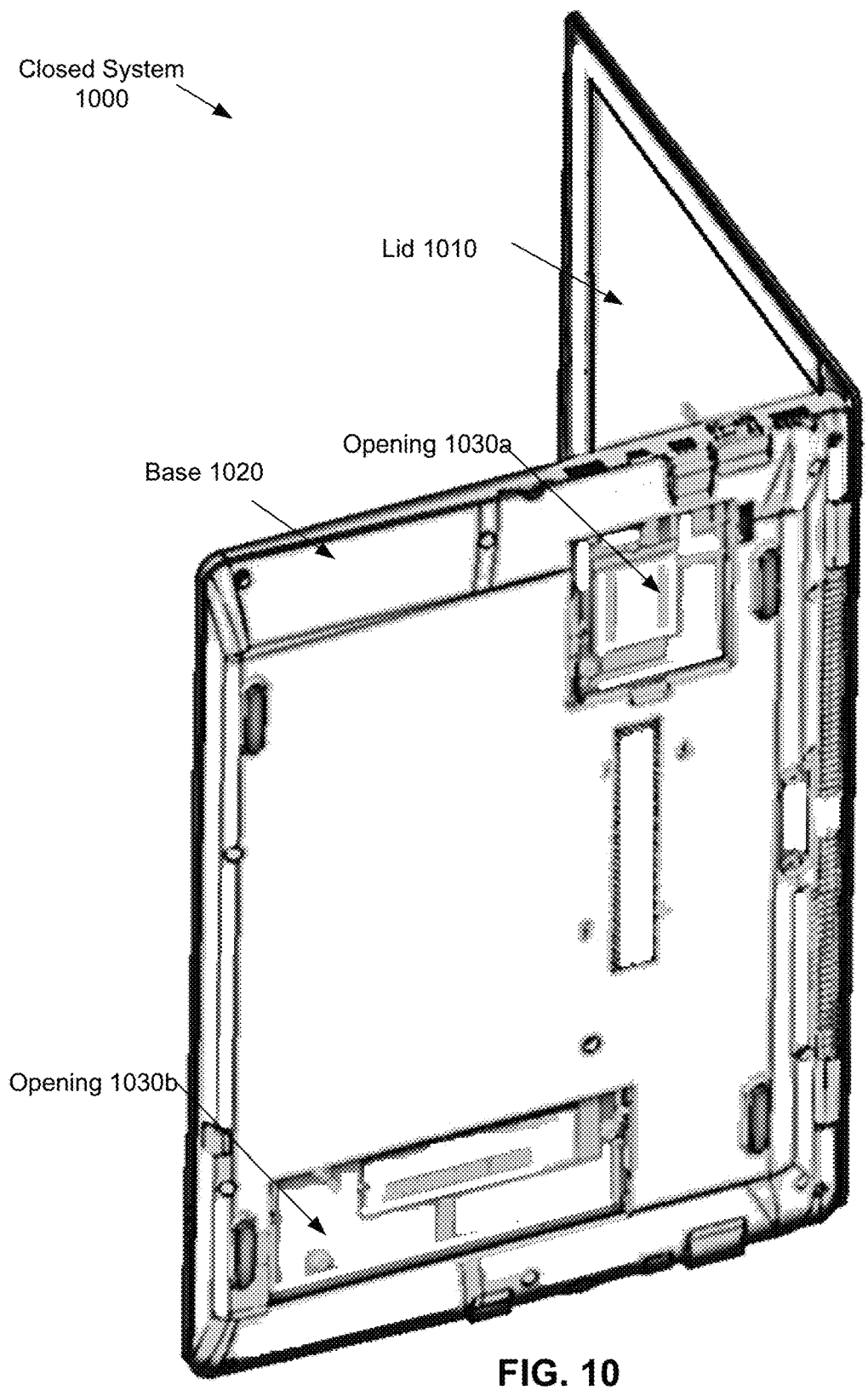
FIG. 10 illustrates a closed system for engaging with a probe connector, according to one embodiment.

FIG. 10 illustrates a closed system 1000 for engaging with a probe connector 200, according to one embodiment. In one embodiment, the closed system 1000 is a laptop. The closed system 1000 includes a lid 1010, a base 1020, openings 1030 for accessibility to modules (e.g., circuit board 100, thermal attach mounting holes 130, etc.). A cover may be removed to access an opening 1030. An opening 1030 may provide access to a probing pad structure 110 around a thermal attach mounting hole 130. A probe connector 200 may engage the surface area 120 of circuit board 100 around a thermal attach mounting hole 130 of the closed system 1000 via the opening 1030 without removal of the complete D-skin of the system (e.g., closed system 1000, system 800), which substantially helps during field failure issue debugging. A surface mounted debug connector and a chassis mount connector may require removing the D-skin of the system.

The probe connector 200 is to be used on one or more of RVP, a development platform or kit (e.g., Aero, Edison (Arduino), Quark-based developer kits, etc.), CRB, and form-factor circuit boards in open systems and closed systems. In one implementation, the same probe connector 200 is to be used on each of RVP, a development platform or kit, CRB, and form-factor circuit boards. In one implementation, the same probe connector 200 is to be used on a first type of circuit board 100 (e.g., an RVP, a development platform or kit, a CRB, or form-factor circuit board) and a second type of circuit board 100, where the first type of circuit board 100 is different from the second type of circuit board 100. In one implementation, a first type of probe connector 200 is to be used on a first type of circuit board 100 and a second type of probe connector 200 is to be used on a second type of circuit board 100, where the first type of probe connector 200 is different from the second type of probe connector 200 and the first type of circuit board 100 is different from the second type of circuit board 100. The probe connector 200 has applications of debugging during platform validation, form-factor board post-validation, and field failure issue resolution. During failure debug, a thermal attach can be un-screwed and the thermal attach mounting hole 130 can be utilized for engaging a probe connector.

The probe connector 200 and probing pad structure 110 eliminate the need for soldering a surface mounted debug connector (e.g., XDP surface mounted debug connector) for debug of field failure issues, saves the surface mounted debug connector signal routing area (e.g., about 1100 mm$^2$) and connector area on the circuit board 100. The routing layer can be effectively used for other critical signals routing.

Resistors (e.g., standard instrumentation platform (SIP) resistors) on the circuit board can be moved to probe 500, saving routing and circuit board 100 area. The probe connector 200 and probing pad structure 110 have a wider scope in the validation environment (e.g., RVP, a development platform or kit (e.g., Aero, Edison (Arduino), quark-based developer kits), CRB, etc.) by not being restricted to one type of debugging. The probe connector 200 and probing pad structure 110 support varying use cases without adding any overhead on the circuit board design.

The probe connector 200 and probing pad structure 110 can co-exist with socket retention hardware that is typically used on RVPs, development platforms or kits, or CRBs. The probe connector 200 and probing pad structure 110 may be a plug and use type of probing solution saving unwanted overhead cost.

The probe connector 200 and probing pad structure 110 has minimal use of critical routing layers. The probe connector 200 and probing pad structure 110 allow reference platforms to be designed very close to the customer product and RVP, a development platform or kit, or CRB collaterals can be directly leveraged by the customers. The probe connector 200 and probing pad structure 110 provides effective utilization of thermal and socket hardware attachment holes on form factor, RVP, a development platform or kit, and CRB circuit boards 100 for debug purposes without adding additional cost. The probe connector 200 and probing pad structure 110 has a debug option on form-factor circuit boards 100 during pre- and/or post-validation. During power-on or critical debug on internal platforms, the probe connector 200 and probing pad structure 110 provide a debug opportunity even before universal serial bus (USB) interfaces are activated.

In various implementations, the system 800 and/or closed system 1000 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 800 and/or closed system 1000 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "under," "between," "disposed on," and "on" as used herein refer to a relative position of one material layer or component with respect to other layers or components. For example, one layer disposed on, over, or under another layer may be directly in contact with the other layer or may have one or more intervening layers. Moreover, one layer disposed between two layers may be directly in contact with the two layers or may have one or more intervening layers. Similarly, unless explicitly stated otherwise, one feature disposed between two features may be in direct contact with the adjacent features or may have one or more intervening layers.

Implementations of the disclosure may be formed or carried out in part on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

The following examples pertain to further embodiments.

Example 1 is a probe connector comprising: a socket frame comprising a first upper surface and a first lower surface, wherein a first channel is from the first upper surface to the first lower surface; a plurality of socket conductors disposed in the socket frame around the first channel, wherein each of the plurality of socket conductors is substantially perpendicular to and traverses the first upper surface and the first lower surface; and an elongated body comprising a second upper surface and a second lower surface, wherein: a second channel is from the second upper surface to the second lower surface; the second channel is disposed at a first distal end of the elongated body; the second lower surface of the elongated body is disposed on the first upper surface of the socket frame; and the plurality of socket conductors are to make electrical contact with a probing pad structure disposed on a surface area around a thermal attach mounting hole of a circuit board in response to a loading attachment engaging with the elongated body via the second channel, the socket frame via the first channel, and the circuit board via the thermal attach mounting hole.

In Example 2, the subject matter of Example 1, wherein the elongated body is a printed circuit board.

In Example 3, the subject matter of any one of Examples 1-2, wherein the elongated body is a flexible printed circuit.

In Example 4, the subject matter of any one of Examples 1-3 further comprising a stiffener comprising a third upper surface and a third lower surface, wherein: a third channel is from the third upper surface to the third lower surface; the third lower surface is disposed on the second upper surface; and the plurality of socket conductors are to make electrical contact with the probing pad structure in response to the loading attachment engaging with the stiffener via the third channel, the elongated body via the second channel, the socket frame via the first channel, and the circuit board via the thermal attach mounting hole.

In Example 5, the subject matter of any one of Examples 1-4, wherein: the socket frame comprises socket frame guiding features on the first lower surface; the surface area comprises orientation guiding features; and in response to the socket frame guiding features coupling with the orientation guiding features, traces in the circuit board and conductors in the elongated body are to be electrically coupled and are to be aligned.

Example 6 is a system comprising: a circuit board; a probing pad structure disposed on a surface area of the circuit board around a thermal attach mounting hole of the circuit board; a probe connector comprising: a socket frame comprising a first channel; a plurality of socket conductors disposed in the socket frame around the first channel; and an elongated body comprising a first distal end, wherein the first distal end comprises a second channel; and a loading attachment, wherein the plurality of socket conductors are to make electrical contact with the probing pad structure in response to the loading attachment engaging with the elongated body via the second channel, the socket frame via the first channel, and the circuit board via the thermal attach mounting hole.

In Example 7, the subject matter of Example 6, further comprising a second probing pad structure disposed on a second surface area around a second thermal attach mounting hole of the circuit board, wherein: the probe connector is to transmit a first set of signals to a probe in response to the plurality of socket conductors making electrical contact with the probing pad structure; and the probe connector is to transmit a second set of signals to the probe in response to the plurality of socket conductors making electrical contact with the second probing pad structure; and the second set of signals is a different type of signals than the first set of signals.

In Example 8, the subject matter of any one of Examples 6-7, wherein: the socket frame comprises one or more socket frame guiding features; and the surface area comprises one or more orientation guiding features to couple with the one or more socket frame guiding features.

In Example 9, the subject matter of any one of Examples 6-8, wherein, in response to the socket frame guiding features coupling with the orientation guiding features: traces in the circuit board and conductors in the elongated body are to be electrically coupled; and the traces in the circuit board and the conductors in the elongated body are to be aligned.

In Example 10, the subject matter of any one of Examples 6-9, wherein the circuit board is a motherboard in a closed system, wherein the plurality of socket conductors are to make electrical contact with the probing pad structure in response to the loading attachment engaging with the elongated body via the second channel, the socket frame via the first channel, and the circuit board via the thermal attach mounting hole without removing the circuit board from the closed system.

In Example 11, the subject matter of any one of Examples 6-10, wherein the circuit board is at least one of a reference validation platform or a customer reference board.

In Example 12, the subject matter of any one of Examples 6-11, wherein the loading attachment provides about a 25 gram/pin load on each of the plurality of socket conductors.

In Example 13, the subject matter of any one of Examples 6-12, wherein the loading attachment is a screw adapted to mount to the circuit board.

In Example 14, the subject matter of any one of Examples 6-13, wherein the loading attachment is a spring-based snap attachment adapted to mount to the circuit board.

In Example 15, the subject matter of any one of Examples 6-14, wherein a stand-off is coupled to the circuit board, the stand-off comprising a threading area projecting through the thermal attach mount hole, wherein the loading attachment is to couple the probe connector to the circuit board via the threading area of the stand-off.

In Example 16, the subject matter of any one of Examples 6-15, wherein the loading attachment is to removably couple the probe connector to an upper surface of the circuit board and the loading attachment is to removably couple the probe connector to a lower surface of the circuit board.

Example 17 is a system comprising: a probe; and a probe connector coupled to the probe, the probe connector comprising: a socket frame comprising a first channel; a plurality of socket conductors disposed in the socket frame around the first channel; and an elongated body comprising a first distal end and a second distal end, wherein: the first distal end comprises a second channel and the second distal end is to couple to the probe; the plurality of socket conductors are to make electrical contact with a probing pad structure disposed on a surface area around a thermal attach mounting hole of a circuit board in response to a loading attachment engaging with the socket frame via the first channel, the elongated body via the second channel, and the circuit board via the thermal attach mounting hole; and the probe is to measure a signal at the probing pad structure via the probe connector.

In Example 18, the subject matter of Example 17, wherein the probe is a debugging probe and the signal comprises a debug signal corresponding to a central processing unit coupled to the circuit board.

In Example 19, the subject matter of any one of Examples 17-18, wherein the probe is a debugging probe and the signal comprises a debug signal corresponding to a platform controller hub coupled to the circuit board.

In Example 20, the subject matter of any one of Examples 17-19, wherein the probe is a voltage measurement probe and the signal comprises a voltage margining signal from the circuit board.

Example 21 is an apparatus comprising: a first plurality of conductors; means for holding the first plurality of conductors around a first channel in the means for holding, each of the first plurality of conductors being substantially parallel; an elongated body comprising a second plurality of conductors, wherein: a first distal end of the second plurality of conductors is to make electrical contact with the first plurality of conductors; and the elongated body comprises a second channel disposed proximate the first distal end; and means for electrically coupling the first plurality of conductors with a probing pad structure disposed on a surface area around a thermal attach mounting hole of the circuit board.

In Example 22, the subject matter of Example 21, wherein the means for electrically coupling further comprises means for fastening the apparatus to the surface area around the thermal attach mounting hole of the circuit board.

In Example 23, the subject matter of any one of Examples 21-22, wherein a second distal end of the second plurality of conductors is to couple with a means for measuring signals from the circuit board.

In Example 24, the subject matter of any one of Examples 21-23, wherein the means for fastening comprises a means for extending through the thermal attach mounting hole from a first side of the circuit board and a means for coupling to the means for extending on a second side of the circuit board.

Various embodiments can have different combinations of the structural features described above. For instance, all optional features of the computing system described above can also be implemented in a method or process and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments may be described with reference to a probe connector for a probing pad structure around a thermal attach mounting hole. The embodiments can also be applicable to other types of integrated circuits and programmable logic devices. For example, the disclosed embodiments are not limited to desktop computer systems or portable computers, such as the Intel® Ultrabooks™ computers, and can be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments can especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but can also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a circuit board, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate can provide a 0 or a 1 during operation. But a logic gate 'configured to' provide an enable signal to a clock does not include every potential logic gate that can provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:

1. A probe connector comprising:
a socket frame comprising a first upper surface and a first lower surface, wherein a first channel is from the first upper surface to the first lower surface;
a plurality of socket conductors disposed in the socket frame around the first channel, wherein each of the plurality of socket conductors is substantially perpendicular to and traverses the first upper surface and the first lower surface; and
an elongated body comprising a second upper surface and a second lower surface, wherein:
a second channel is from the second upper surface to the second lower surface;
the second channel is disposed at a first distal end of the elongated body;
the second lower surface of the elongated body is disposed on the first upper surface of the socket frame; and
the plurality of socket conductors are to make electrical contact with a probing pad structure disposed on a surface area around a thermal attach mounting hole of a circuit board in response to a loading attachment engaging with the elongated body via the second channel, the socket frame via the first channel, and the circuit board via the thermal attach mounting hole.

2. The probe connector of claim 1, wherein the elongated body is a printed circuit board.

3. The probe connector of claim 1, wherein the elongated body is a flexible printed circuit.

4. The probe connector of claim 1 further comprising a stiffener comprising a third upper surface and a third lower surface, wherein:
a third channel is from the third upper surface to the third lower surface;
the third lower surface is disposed on the second upper surface; and
the plurality of socket conductors are to make electrical contact with the probing pad structure in response to the loading attachment engaging with the stiffener via the third channel, the elongated body via the second channel, the socket frame via the first channel, and the circuit board via the thermal attach mounting hole.

5. The probe connector of claim 1, wherein:
the socket frame comprises socket frame guiding features on the first lower surface;
the surface area comprises orientation guiding features; and
in response to the socket frame guiding features coupling with the orientation guiding features, traces in the circuit board and conductors in the elongated body are to be electrically coupled and are to be aligned.

6. A system comprising:
a circuit board;

a probing pad structure disposed on a surface area of the circuit board around a thermal attach mounting hole of the circuit board;
a probe connector comprising:
a socket frame comprising a first channel;
a plurality of socket conductors disposed in the socket frame around the first channel; and
an elongated body comprising a first distal end, wherein the first distal end comprises a second channel; and
a loading attachment, wherein the plurality of socket conductors are to make electrical contact with the probing pad structure in response to the loading attachment engaging with the elongated body via the second channel, the socket frame via the first channel, and the circuit board via the thermal attach mounting hole.

7. The system of claim 6, further comprising a second probing pad structure disposed on a second surface area around a second thermal attach mounting hole of the circuit board, wherein:
the probe connector is to transmit a first set of signals to a probe in response to the plurality of socket conductors making electrical contact with the probing pad structure; and
the probe connector is to transmit a second set of signals to the probe in response to the plurality of socket conductors making electrical contact with the second probing pad structure; and
the second set of signals is a different type of signals than the first set of signals.

8. The system of claim 6, wherein:
the socket frame comprises one or more socket frame guiding features; and
the surface area comprises one or more orientation guiding features to couple with the one or more socket frame guiding features.

9. The system of claim 8, wherein, in response to the socket frame guiding features coupling with the orientation guiding features:
traces in the circuit board and conductors in the elongated body are to be electrically coupled; and
the traces in the circuit board and the conductors in the elongated body are to be aligned.

10. The system of claim 6, wherein the circuit board is a motherboard in a closed system, wherein the plurality of socket conductors are to make electrical contact with the probing pad structure in response to the loading attachment engaging with the elongated body via the second channel, the socket frame via the first channel, and the circuit board via the thermal attach mounting hole without removing the circuit board from the closed system.

11. The system of claim 6, wherein the circuit board is at least one of a reference validation platform or a customer reference board.

12. The system of claim 6, wherein the loading attachment provides a 25 to 35 grams/pin load on each of the plurality of socket conductors.

13. The system of claim 6, wherein the loading attachment is a screw adapted to mount to the circuit board.

14. The system of claim 6, wherein the loading attachment is a spring-based snap attachment adapted to mount to the circuit board.

15. The system of claim 6, wherein a stand-off is coupled to the circuit board, the stand-off comprising a threading area projecting through the thermal attach mount hole, wherein the loading attachment is to couple the probe connector to the circuit board via the threading area of the stand-off.

16. The system of claim 6, wherein the loading attachment is to removably couple the probe connector to an upper surface of the circuit board and the loading attachment is to removably couple the probe connector to a lower surface of the circuit board.

17. A system comprising:
a probe; and
a probe connector coupled to the probe, the probe connector comprising:
a socket frame comprising a first channel;
a plurality of socket conductors disposed in the socket frame around the first channel; and
an elongated body comprising a first distal end and a second distal end, wherein:
the first distal end comprises a second channel and the second distal end is to couple to the probe;
the plurality of socket conductors are to make electrical contact with a probing pad structure disposed on a surface area around a thermal attach mounting hole of a circuit board in response to a loading attachment engaging with the socket frame via the first channel, the elongated body via the second channel, and the circuit board via the thermal attach mounting hole; and
the probe is to measure a signal at the probing pad structure via the probe connector.

18. The system of claim 17, wherein the probe is a debugging probe and the signal comprises a debug signal corresponding to a central processing unit coupled to the circuit board.

19. The system of claim 17, wherein the probe is a debugging probe and the signal comprises a debug signal corresponding to a platform controller hub coupled to the circuit board.

20. The system of claim 17, wherein the probe is a voltage measurement probe and the signal comprises a voltage margining signal from the circuit board.

* * * * *